(12) United States Patent
Hung et al.

(10) Patent No.: US 9,190,451 B2
(45) Date of Patent: Nov. 17, 2015

(54) LIGHT EMITTING DIODE ARRAY AND METHOD FOR MANUFACTURING THE SAME

(75) Inventors: Tzu-Chien Hung, Hsinchu (TW); Chia-Hui Shen, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 479 days.

(21) Appl. No.: 13/422,142

(22) Filed: Mar. 16, 2012

(65) Prior Publication Data
US 2013/0032815 A1    Feb. 7, 2013

(30) Foreign Application Priority Data

Aug. 5, 2011    (CN) .......................... 2011 1 0223564

(51) Int. Cl.
| | |
|---|---|
| H01L 33/00 | (2010.01) |
| H01L 33/08 | (2010.01) |
| H01L 27/15 | (2006.01) |
| H01L 33/10 | (2010.01) |
| H01L 33/20 | (2010.01) |
| H01L 33/22 | (2010.01) |
| H01L 33/62 | (2010.01) |

(52) U.S. Cl.
CPC ................ *H01L 27/156* (2013.01); *H01L 33/10* (2013.01); *H01L 33/20* (2013.01); *H01L 33/22* (2013.01); *H01L 33/62* (2013.01); *H01L 2924/0002* (2013.01)

(58) Field of Classification Search
CPC ................................ H01L 33/00; H01L 33/08
See application file for complete search history.

(56) References Cited

U.S. PATENT DOCUMENTS

| | | | |
|---|---|---|---|
| 7,683,377 B2* | 3/2010 | Nagai ............................. | 257/79 |
| 7,709,849 B1 | 5/2010 | Kal et al. | |
| 8,415,179 B2* | 4/2013 | Hung et al. ..................... | 438/22 |
| 8,421,107 B2* | 4/2013 | Shinohara et al. .............. | 257/98 |
| 8,759,121 B2* | 6/2014 | Hung et al. ..................... | 438/22 |
| 2010/0117056 A1 | 5/2010 | Nagai | |
| 2010/0317132 A1* | 12/2010 | Rogers et al. .................. | 438/27 |

FOREIGN PATENT DOCUMENTS

| | | |
|---|---|---|
| TW | 200512952 A1 | 4/2005 |
| TW | 201013987 A1 | 4/2010 |
| TW | 201025558 A1 | 7/2010 |

* cited by examiner

*Primary Examiner* — Mohammad Choudhry
(74) *Attorney, Agent, or Firm* — Novak Druce Connolly Bove + Quigg LLP

(57) ABSTRACT

An LED array includes a substrate, protrusions formed on a top surface of the substrate, and LEDs formed on the top surface of the substrate and located at a top of the protrusions. The LEDs are electrically connected with each other. Each LED includes a connecting layer, an n-type GaN layer, an active layer, and a p-type GaN layer formed on a top of the protrusions in sequence. A bottom surface of the n-type GaN layer connecting the connecting layer has a roughened exposed portion. The bottom surface of the n-type GaN layer has an N-face polarity.

11 Claims, 9 Drawing Sheets

LIGHT EMITTING DIODE ARRAY AND METHOD FOR MANUFACTURING THE SAME

BACKGROUND

1. Technical Field

The present disclosure relates to semiconductor devices and, particularly, to a light emitting diode (LED) array and a method for manufacturing the LED array.

2. Description of Related Art

LEDs have many beneficial characteristics, including low electrical power consumption, low heat generation, long lifetime, small volume, good impact resistance, fast response and excellent stability. These characteristics have enabled the LEDs to be widely used as a light source in electrical appliances and electronic devices.

In general, the light output of an LED depends on the quantum efficiency of the active layer and the light extraction efficiency. As the light extraction efficiency increases, the light output of the LED is enhanced. In order to improve the light extraction efficiency, efforts are made to overcome the significant photon loss resulting from total reflection inside the LED after emission from the active layer.

There are several methods for increasing the light extraction efficiency of the LED. A typical method is to roughen the surface of the LED by etching, thereby reducing total reflection inside the LED and finally increasing the light extraction efficiency of the LED. However, it is difficult to roughen the surface of the conventional LED, and the etching process is usually time-consuming.

What is needed is an LED array and a method for manufacturing the LED array which can overcome the problem of the prior art.

DETAILED DESCRIPTION

Figure 1:
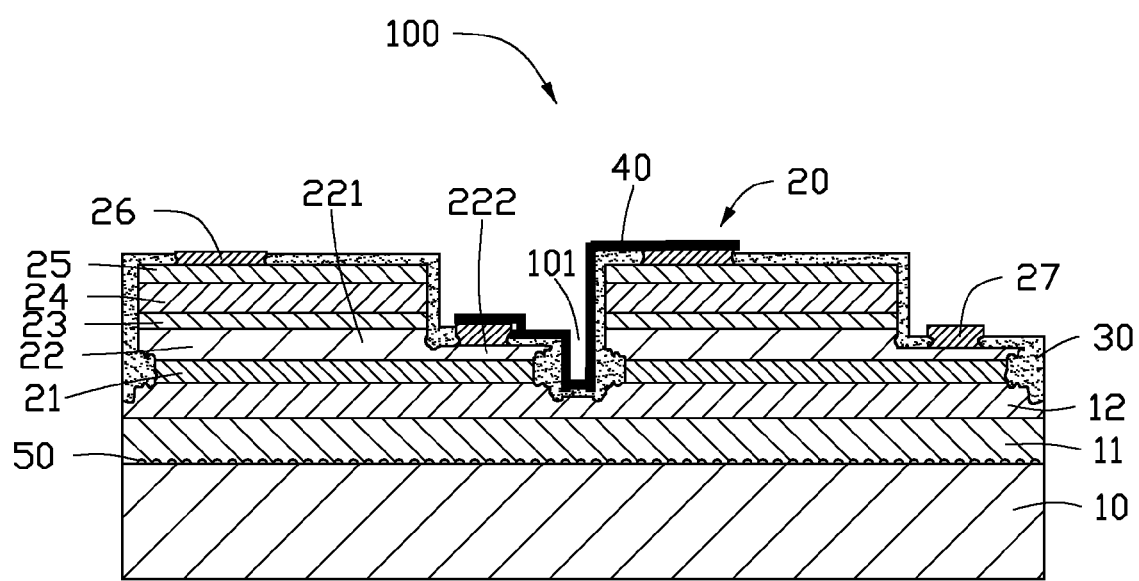
FIG. 1 is a cross section of an LED array according to a first embodiment of the present disclosure.

Referring to FIG. 1, an LED array 100 according to a first embodiment is shown. The LED array 100 includes a substrate 10, a plurality of LEDs 20 formed on a top side of the substrate 10, insulating layers 30 each electrically insulating two adjacent LEDs 20, electrically-conductive wires 40 each electrically connecting two adjacent LEDs 20, and a plurality of protrusions 50 formed between the substrate 10 and the LEDs 20.

In this embodiment, the LED array 100 includes four LEDs 20. However, the number of the LEDs 20 is not limited; it can be two, three or more than four. Each LED 20 includes a connecting layer 21, an n-type GaN layer 22, an active layer 23, a p-type GaN layer 24, a transparent conductive layer 25, a p-type electrode 26 and an n-type electrode 27. The connecting layer 21, the n-type GaN layer 22, the active layer 23, the p-type GaN layer 24 and the transparent conductive layer 25 are formed on the substrate 10 in sequence from bottom to top.

The connecting layer 21 can be etched easily by alkaline solution under 100 degrees centigrade. The connecting layer 21 has an area smaller than that of the n-type GaN layer 22. Thus, a bottom surface of the n-type GaN layer 22, which faces the connecting layer 21, has its peripheral portion exposed. The connecting layer 21 can be made of a material selected from a group consisting of AlN, SiO2, silicon nitride and so on. In this embodiment, the connecting layer 21 is made of AlN. Preferably, a thickness of the connecting layer 21 is in a range of 5 nm to 1000 nm. When the thickness of the connecting layer 21 is greater than 5 nm, an etching solution can easily penetrate into the connecting layer 21. However, when the thickness of the connecting layer 21 is greater than 1000 nm, a semiconductor structure formed on the connecting layer 21 will crack due to a great stress generated between the semiconductor structure and the connecting layer 21. The connecting layer 21 has an electrical resistance much greater than that of the LED 20. For example, the electrical resistance of the connecting layer 21 formed of AlN is about 2000 ohms; however, the electrical resistance of the LED 20 is just about 10 ohms to 20 ohms.

A bottom surface of the n-type layer 22 has an N-face polarity. The so called GaN layer with Ga-face polarity has its Ga atoms arranged on a top lattice plane thereof. The GaN layer with N-face polarity has its N atoms arranged on the top lattice plane thereof. The GaN layer with N-face polarity can be etched by alkaline solution under 100 degrees centigrade to form a rough surface with hexagonal pyramid features. On the contrary, the Ga-face GaN does not react with alkaline solution under 100 degrees centigrade.

The exposed peripheral portion of the bottom surface of the n-type layer 22 is roughened to improve the light extraction efficiency of the LED 20. The n-type GaN 22 has a top surface away from the connecting layer 21, wherein the top surface includes a first area 221 and a second area 222. The active layer 23, the p-type GaN 24, the transparent conductive layer 25, and the p-type electrode 26 are formed on the first area 221 in sequence from bottom to top. The n-type electrode 27 is formed on the second area 222. The transparent conductive layer 25 can be made of Ni—Au alloy or indium tin oxide (ITO). In the present embodiment, the transparent conductive layer 70 is made of ITO.

The substrate 10 is made of a material selected from a group consisting of Si, SiC, sapphire and so on. In order to improve light extraction efficiency of the LEDs 20, the plurality of protrusions 50 are formed on a top surface of the substrate 10 facing the LEDs 20. The protrusions 50 reflect light emitted from the active layer 23 toward a light emitting surface (i.e., a top face of the transparent conductive layer 25) of the LED 20 to make more light which can emit from the LED 20. In the present embodiment, each protrusion 50 is a hemisphere.

In order to improve the quality of the semiconductor layers, a buffer layer 11 and a GaN layer 12 can be formed on the top surface of the substrate 10 before forming the connecting layer 21. The protrusions 50 are received in a bottom end of the buffer layer 11. Preferably, the GaN layer 12 is an n-type GaN, and a top surface of the GaN layer 12 away from the substrate 10 has a Ga-face polarity.

Figure 2:
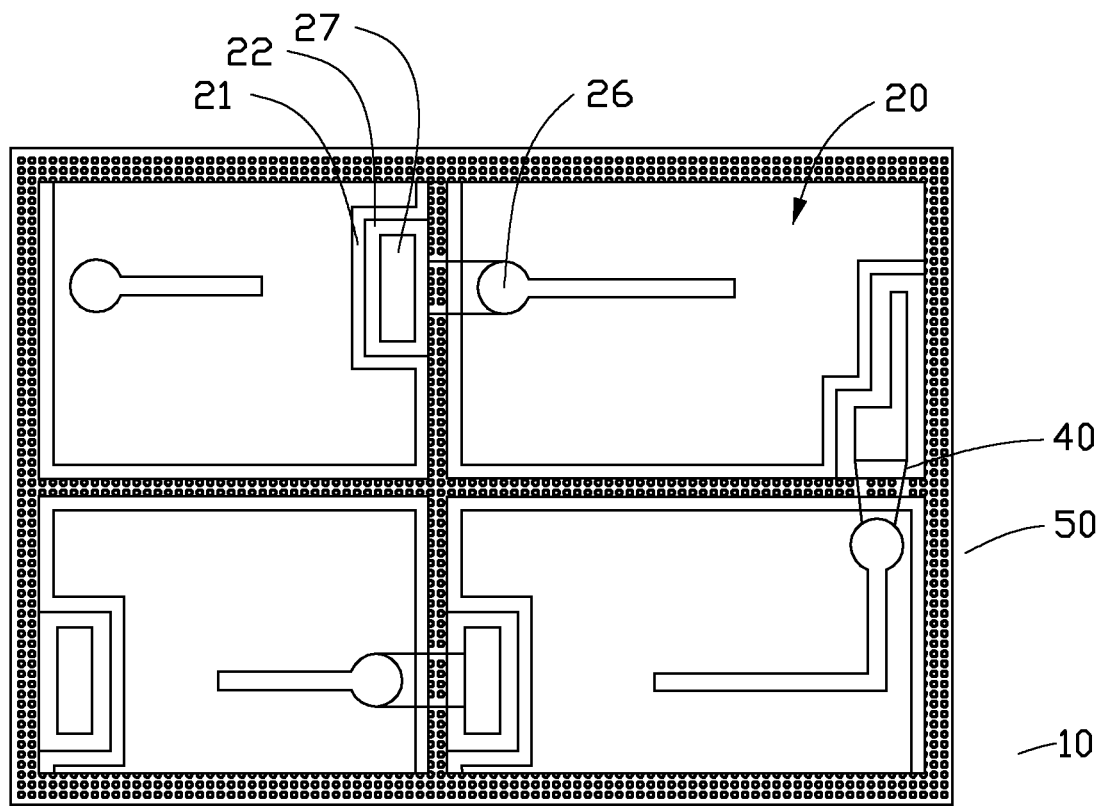
FIG. 2 is a partly top view of the LED array of FIG. 1.

A groove 101 is defined between each two adjacent LEDs 20 to separate the two adjacent LEDs 20 from each other. The groove 101 extends through the connecting layer 21, the n-type GaN 22, the active layer 23, the p-type GaN layer 25 and the transparent conductive layer 25. The grooves 101 are also extended into a top portion of the GaN layer 12 at a region where the insulating layers 30 and the conductive wires 40 are to be formed. At a region other than the insulating layers 30 and the conductive wires 40 to be formed, the grooves 101 are further extended to the substrate 10 through the GaN layer 12 and the buffer layer 11 to expose the protrusions 50 (better seen in FIG. 2). The insulating layers 30 cover a portion of top surfaces of the LEDs 20 between the electrodes 26, 27. Each insulating layer 30 also extends into a portion of a corresponding groove 101 between the neighboring two electrodes 26, 27 of the two adjacent LEDs 20 for protecting the LEDs 20 and avoiding short-circuit between the two adjacent LEDs 20 when the wires 40 are formed in a following step.

Figure 3:
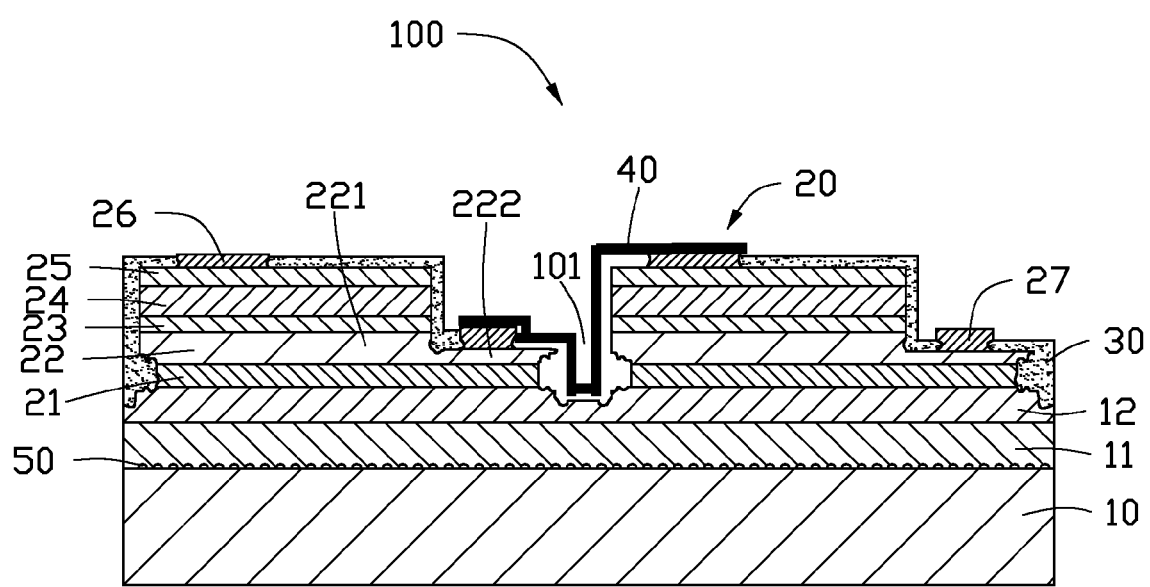
FIG. 3 is a cross section of an LED array according to a second embodiment of the present disclosure.

The wires 40 are formed on the insulating layers 30, and the LEDs 20 are connected in parallel or series with each other by the wires 40. In this embodiment, the LEDs 20 are connected in series by the wires 40. That is, each of the wires 40 has one end connected to the p-type electrode 26 of one of the LEDs 20, and the other end connected to the n-type electrode 27 of an adjacent LED 20. Alternatively, as shown in FIG. 3, a portion of the insulating layer 30 in the groove 101 between the two adjacent electrodes 26, 27 of the two adjacent LEDs 20 is omitted and the wire 40 connects the two adjacent electrodes 26, 27 of the two adjacent LEDs 20 directly.

A method for manufacturing the LED array 100 according to the exemplary embodiment is described as follows.

Figure 4:
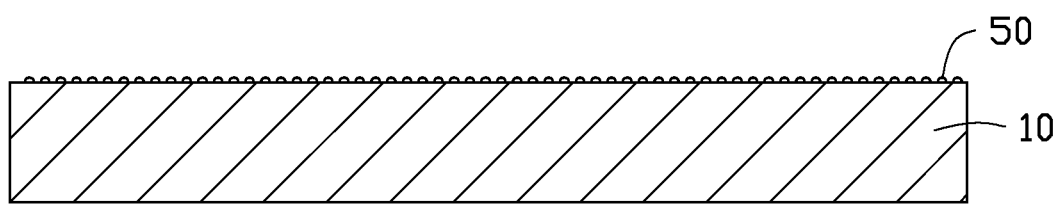
FIGS. 4-9 are views showing steps of a method for manufacturing the LED array of FIG. 1.

Referring to FIG. 4, a substrate 10 is provided. The substrate 10 can be made of a material selected from a group consisting of Si, SiC, and sapphire, etc.

A plurality of protrusions 50 are formed on a top side of the substrate 10 by etching the substrate 10.

Figure 5:
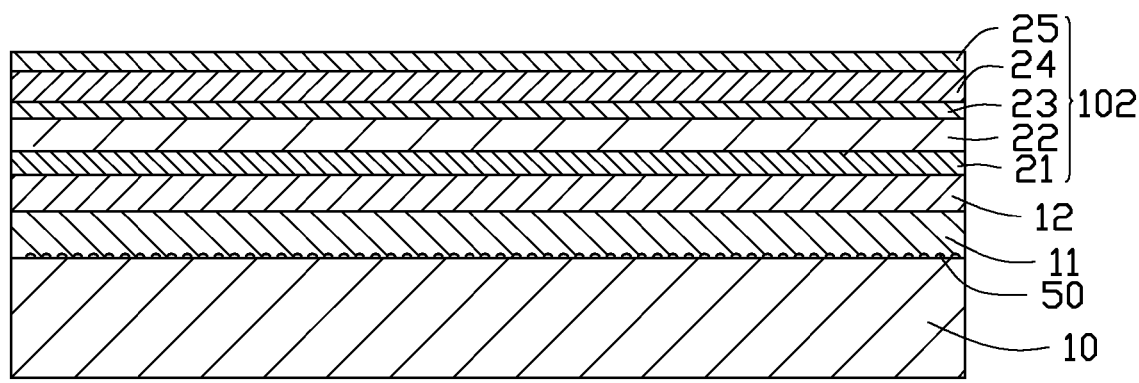

Referring to FIG. 5, a buffer layer 11 and a GaN layer 12 are formed on the substrate 10 to improve the quality of connection of the semiconductor layer 102 on the substrate 10. A surface of the GaN layer 12 away from the substrate 10 has a Ga-face polarity to avoid being etched by alkaline solution.

A semiconductor structure 102 is formed on the GaN layer 12. The semiconductor 102 includes a connecting layer 21, an n-type GaN layer 22, an active layer 23, a p-type GaN layer 24 and a transparent conductive layer 25 formed on the substrate 10 in sequence from bottom to top. The connecting layer 21 has a thickness in a range from 5 nm to 1000 nm. A bottom surface of the n-type GaN layer 22 has an N-face polarity which can be etched easily by alkaline solution.

Figure 6:
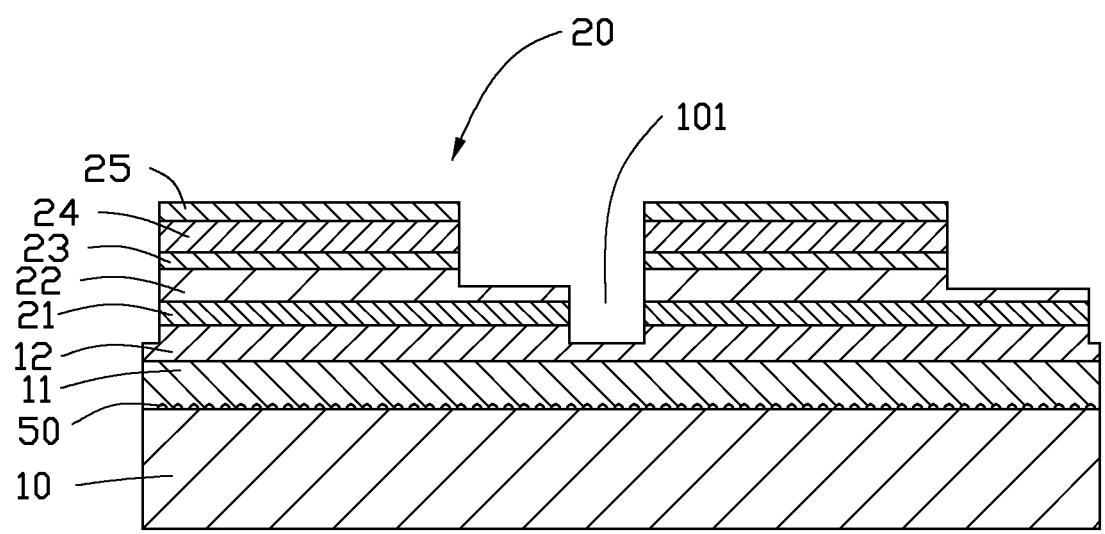

Referring FIG. 6, a plurality of grooves 101 are formed in the semiconductor structure 102 and divide the semiconductor structure 102 into a plurality of LEDs 20. The grooves 101 extend through the transparent conductive layer 25, the p-type GaN layer 24, the active layer 23, the n-type GaN layer 22, the connecting layer 21 and a top portion of the GaN layer 12 at a region where insulating layers 30 and conductive wires 40 are to be formed. At the other region, the grooves 101 are further extended through the GaN layer 12 and the buffer layer 11 to reach the substrate 10 to expose the protrusions 50 (better seen in FIG. 2). The transparent conductive layer 25, the p-type GaN layer 24 and the active layer 23 are etched to expose a portion of the n-type GaN layer 22. In the etching process, a part of the n-type GaN layer 22 is also etched away.

Figure 7:
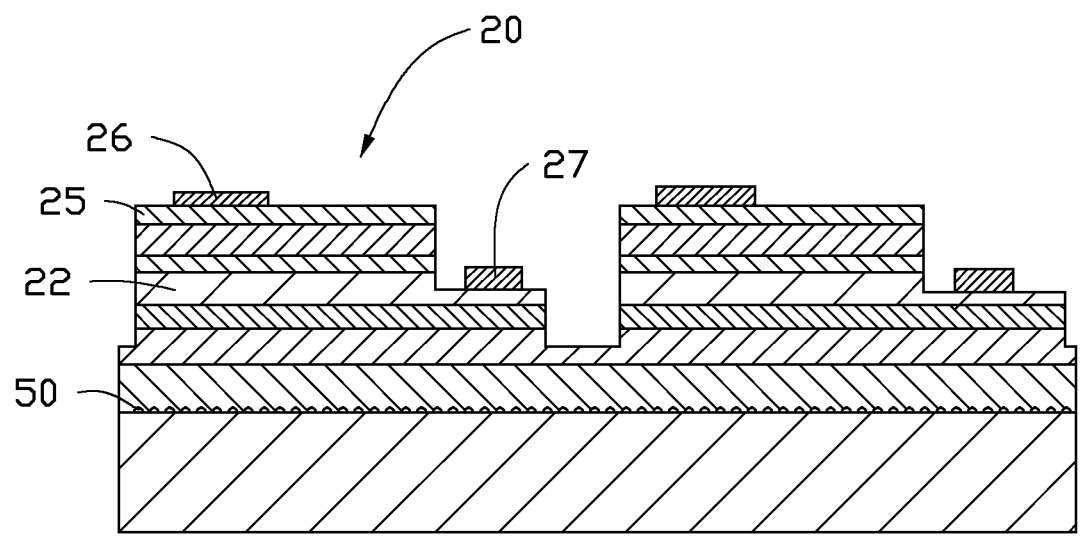

Referring to FIG. 7, a p-type electrode 26 is formed on the transparent conductive layer 25, and an n-type electrode 27 is formed on the exposed portion of the n-type layer 22 of each LED 20.

Figure 8:
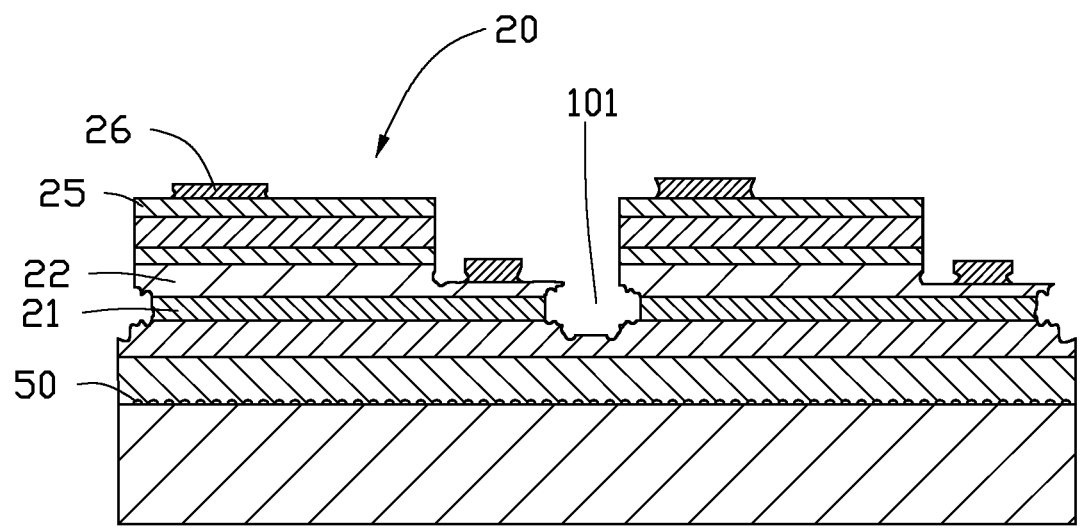

Referring to FIG. 8, a periphery of the connecting layer 21 of the each LED 20 is etched away by alkaline solution to expose portions of a bottom surface of the n-type GaN layer 22. Then the alkaline solution is used to etch and roughen the exposed portions of the bottom surface of the n-type GaN layer 22. In order to accelerate the etching, the alkaline solution can be strong alkaline solution, such as KOH solution, NaOH solution, etc. In this embodiment, the connecting layer 21 and the n-type GaN layer 22 can be etched by KOH solution under a temperature of 85 degree centigrade for 30 to 60 minutes.

Figure 9:
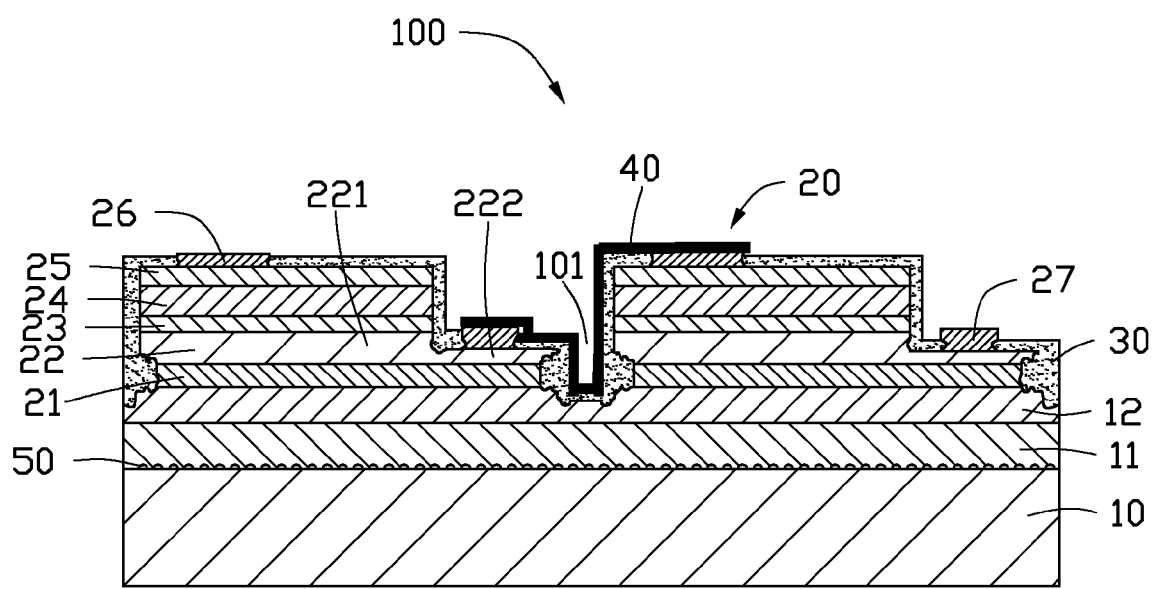

Referring to FIG. 9, the insulating layers 30 are formed in the grooves 101. Then the conductive wires 40 are formed on the insulating layers 30 to form electrical connections between the LEDs 20.

It is understood that, in other embodiments of the method for fabricating the LED array 100, the p-type electrode 26 can be directly formed on the p-type GaN layer 24, without forming the transparent conductive layer 25 on the p-type GaN layer 24 in advance. Furthermore, the p-type electrode 26 and the n-type electrode 27 can also be formed after roughening of the bottom surface of the n-type GaN layer 22.

In the LED array 100, each of the LEDs 20 includes a connecting layer 21 which can be easily etched by alkaline solution. In addition, the bottom surface of the n-type GaN layer 22 adjacent to the connecting layer 21 has an N-face polarity. Therefore, the bottom surface of the n-type GaN layer 22 can be easily roughened to improve light extracting efficiency of the LED 20.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED array comprising:
a substrate;
a plurality of protrusions formed on a top surface of the substrate;
and a plurality of LEDs formed on the top surface of the substrate and located on top of the protrusions, the plurality of LEDs being electrically connected with each other, each LED comprising a connecting layer, an n-type GaN layer, an active layer, and a p-type GaN layer formed on a top of the protrusions in sequence, a bottom surface of the n-type GaN layer connecting upper surface of the connecting layer, wherein the n-type GaN layer is wider than the upper surface of the connecting layer, wherein the n-type GaN layer having a reentrant shape opening, and the reentrant shape opening is roughened to obtain a roughened exposed portion, the bottom surface of the n-type GaN layer having an N-face polarity, wherein the protrusions are spaced from each other and reflect light emitted from the active layer toward a light emitting face of the LED.

2. The LED array as claimed in claim 1, wherein each protrusion is a hemisphere.

3. The LED array as claimed in claim 1, wherein grooves are defined between the LEDs to separate the LEDs from each other, and the grooves extend through the connecting layer, the n-type GaN layer, the active layer, and the p-type GaN layer to expose the protrusions.

4. The LED array as claimed in claim 3, wherein wires are located at the grooves and electrically connect LEDs, the wires covering some of the protrusions.

5. The LED array as claimed in claim 4, wherein insulating layers are formed in the grooves, and the wires are formed on the insulating layers.

6. The LED array as claimed in claim 1, wherein a buffer layer and a GaN layer are formed on the top surface of the substrate in sequence, the protrusions are received in a bottom end of the buffer layer, and the LEDs are formed on a top surface of the GaN layer.

7. The LED array as claimed in claim 6, wherein the GaN layer is an n-type GaN and the top surface of the GaN layer away from the substrate has a Ga-face polarity.

8. The LED array as claimed in claim 1, wherein the connecting layer is made of a material selected from a group consisting of AlN, SiO2, and silicon nitride.

9. The LED array as claimed in claim 1, wherein a thickness of the connecting layer is in a range of 5 nm to 1000 nm.

10. The LED array as claimed in claim 1, wherein the n-type GaN layer has a top surface away from the connecting layer, the top surface comprises a first area and a second area, the active layer and the p-type GaN layer are formed on the first area in sequence, a p-type electrode is formed on the p-type GaN layer, and an n-type electrode is formed on the second area.

11. The LED as claimed in claim 10, wherein a transparent conductive layer is disposed between the p-type electrode and the p-type GaN layer.

\* \* \* \* \*